United States Patent

Bonami et al.

[15] 3,653,033

[45] Mar. 28, 1972

[54] NON-LINEAR DECODER WITH LINEAR AND NON-LINEAR LADDER ATTENUATORS

[72] Inventors: Robert Raoul Charles Bonami, Paris; Claude Paul Henri Lerouge, Maurepas; Didier Charles Strube, Garches, all of France

[73] Assignee: International Standard Electric Corporation, New York, N.Y.

[22] Filed: June 23, 1969

[21] Appl. No.: 842,074

[30] Foreign Application Priority Data

June 25, 1968 France....................................156404

[52] U.S. Cl.....................340/347 DA, 235/150.53, 235/197

[51] Int. Cl.........................................................H03k 13/04

[58] Field of Search........340/347 DA; 235/154, 197, 150.53

[56] References Cited

UNITED STATES PATENTS

| | | | |
|---|---|---|---|
| 3,510,868 | 5/1970 | Chatelon | 340/347 |
| 3,495,237 | 2/1970 | Corre et al. | 340/347 |
| 3,345,505 | 10/1967 | Schmid | 340/347 |
| 3,305,857 | 2/1967 | Barber | 340/347 |
| 3,298,017 | 1/1967 | Avignon et al. | 340/347 |
| 3,290,671 | 12/1966 | Lamoreux | 340/347 |

*Primary Examiner*—Maynard R. Wilbur

*Assistant Examiner*—Michael K. Wolensky

*Attorney*—C. Cornell Remsen, Jr., Walter J. Baum, Percy P. Lantzy, J. Warren Whitesel, Delbert P. Warner and James B. Raden

[57] ABSTRACT

A PCM word decoder has a characteristic curve which is symmetrical with respect to zero abscissa point. Starting from the zero abscissa point, the curve comprises a linear part corresponding to the eight first codes, a logarithmic part corresponding to 40 following codes and a linear part corresponding to the 16 last codes. This is accomplished by two identical ladder attenuators and two sets of current generators. One attenuator and set of generators correspond to the logarithmic part, and the other to the linear part.

6 Claims, 2 Drawing Figures

NON-LINEAR DECODER WITH LINEAR AND NON-LINEAR LADDER ATTENUATORS

The object of the present invention is thus to achieve a decoder, the half-characteristic of which comprises a logarithmic central part and linear extreme parts.

Another object of the present invention is a decoder with composite characteristic curve, the linear parts of which are constituted by straight lines tangent to the ends of the logarithmic curve.

Another object of the present invention is a decoder with composite characteristic curve which is achieved by digital means.

According to a feature of the present invention a decoder of binary numbers comprising $n = 7$ digits, the most significant of which characteristics the polarity of the voltage, the other digits characterizing the amplitude of this voltage measured on both sides of the level of the nil voltage, has a characteristic curve which is symmetrical with respect to zero abscissa point, each part being a curve comprising, starting from the zero abscissa point, a linear part corresponding to the eight first codes, a logarithmic part corresponding to 40 following codes and a linear part corresponding to the 16 last codes; this decoder comprises mainly a register storing the binary number to be decoded, a first decoder decoding the four most significant digits of the said binary number, a second decoder decoding the other digits of the same binary number, two identical ladder attenuators each one comprising five identical cells, a first multiplicity of current generators controlled by the output signals of the second decoder when the binary number corresponds to the logarithmic part, a second multiplicity of current generators controlled by the four least significant digits of the binary number when the binary number corresponds to a linear part, a multiplicity of electronic gates arranged between the current generators and the two attenuators and controlled by the output signals of the first decoder, a first additional generator associated to the first multiplicity of current generators, the current of which is injected in one or the other ladder attenuator through two electronic gates controlled by the signal corresponding to the most significant digit of the binary number, a second additional current generator associated to the second multiplicity of current generators which supplies a current only for the binary numbers corresponding to the 16 last codes; the decoded voltage is that appearing between the output terminals of the two ladder attenuators.

The above mentioned and other features and objects of this invention will become apparent by reference to the following description taken in conjunction with the accompanying drawings in which.

Figure 1:
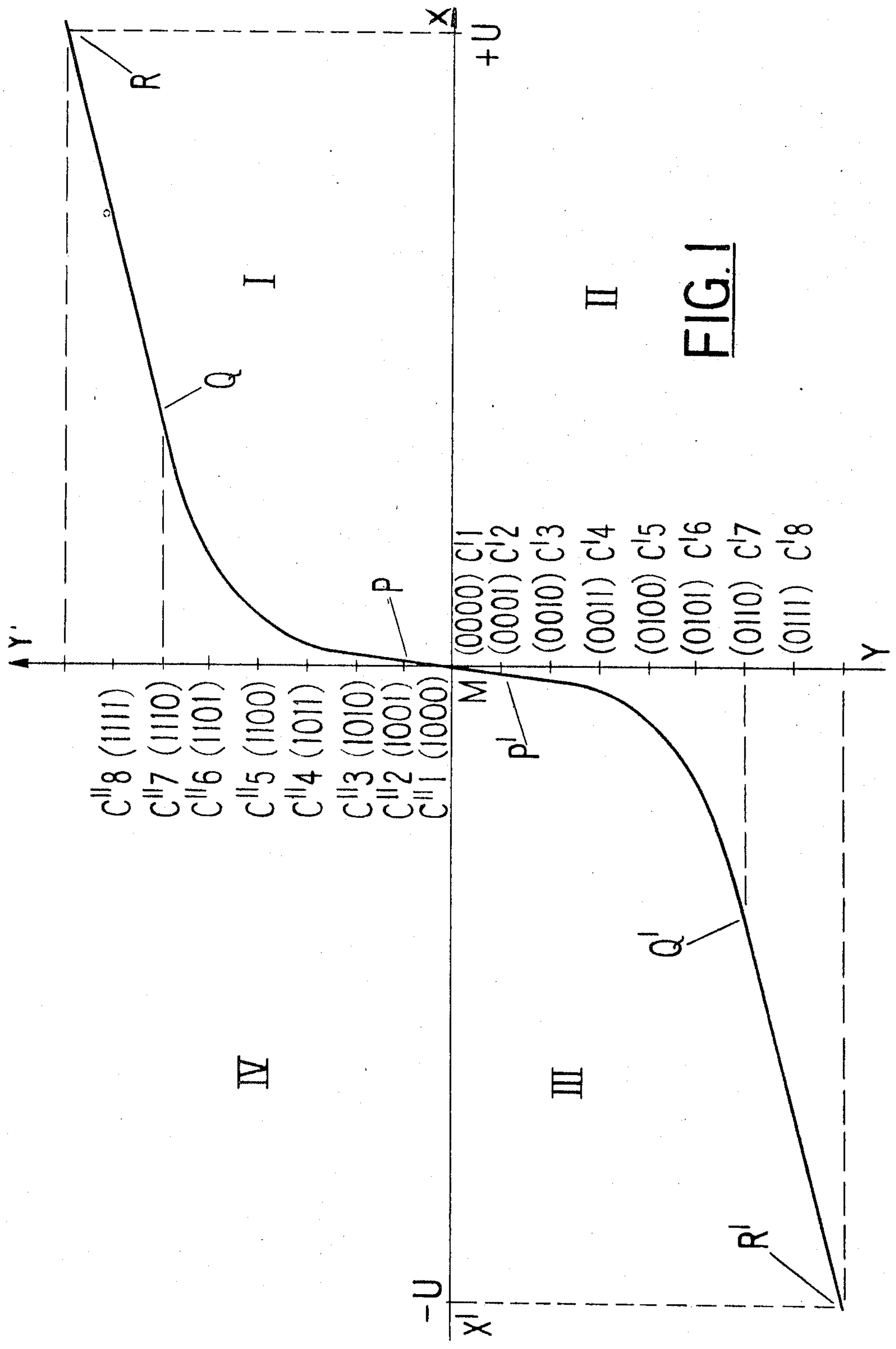
FIG. 1 represents the characteristic curve of the decoder.

The curve located in the quadrant I of FIG. 1 represents a compression curve comprising three parts limited by the points P, Q and R. The part MP is linear and the corresponding straight line has for equation: $253x = 13.23y$ (1), in which equation $x$ is the ratio of amplitude of the signal to be companded to the positive maximum amplitude +U admitted at the input of the compression circuit, $y$ is the homologous ratio for the companded signal. The part PQ is logarithmic and has the equation: $253x = 10^{8y/3} - 0.5$ (2). The part QR is also linear and the corresponding straight line has for equation: $253x = 614y - 361$ (3). The segments MP and QR are tangent respectively to the points P and Q to the logarithmic curve. This curve of the quadrant I corresponds to the compression curve for the positive signals; for the negative signals, the compression curve is that of the quadrant III and it is symmetrical of the curve of quadrant I with respect to the origin M.

Nonlinear coding circuits may be designed in which the compression and coding operations are independent and are carried out successively; however, in most of the circuits described in the literature specialized in this technique, these two operations are carried out simultaneously by mixing the compression operation in the coding operation. On FIG. 1, this comes to graduate directly the ordinate axis Y'My according to the codes chosen, the graduations being regularly spaced. In the particular example considered, the codes have $n = 7$ digits, which correspond to 128 levels on the ordinate axis. In these codes, the most significant digit determines the polarity of the voltage, in such a way that, for instance, the 1 digit corresponds to the positive voltages and the 0 digit to the negative voltages. The six other digits determine, according to the normal binary scale, the amplitude of the voltage on both sides of the nil voltage.

In FIG. 1, we have shown on the axis Y'MY only a few particular codes formed with the most significant four digits of the code, the other digits being zeros. These particular codes have been referenced C'1 to C'8 for the negative amplitude and C''1 to C''8 for the positive amplitudes.

Figure 2:
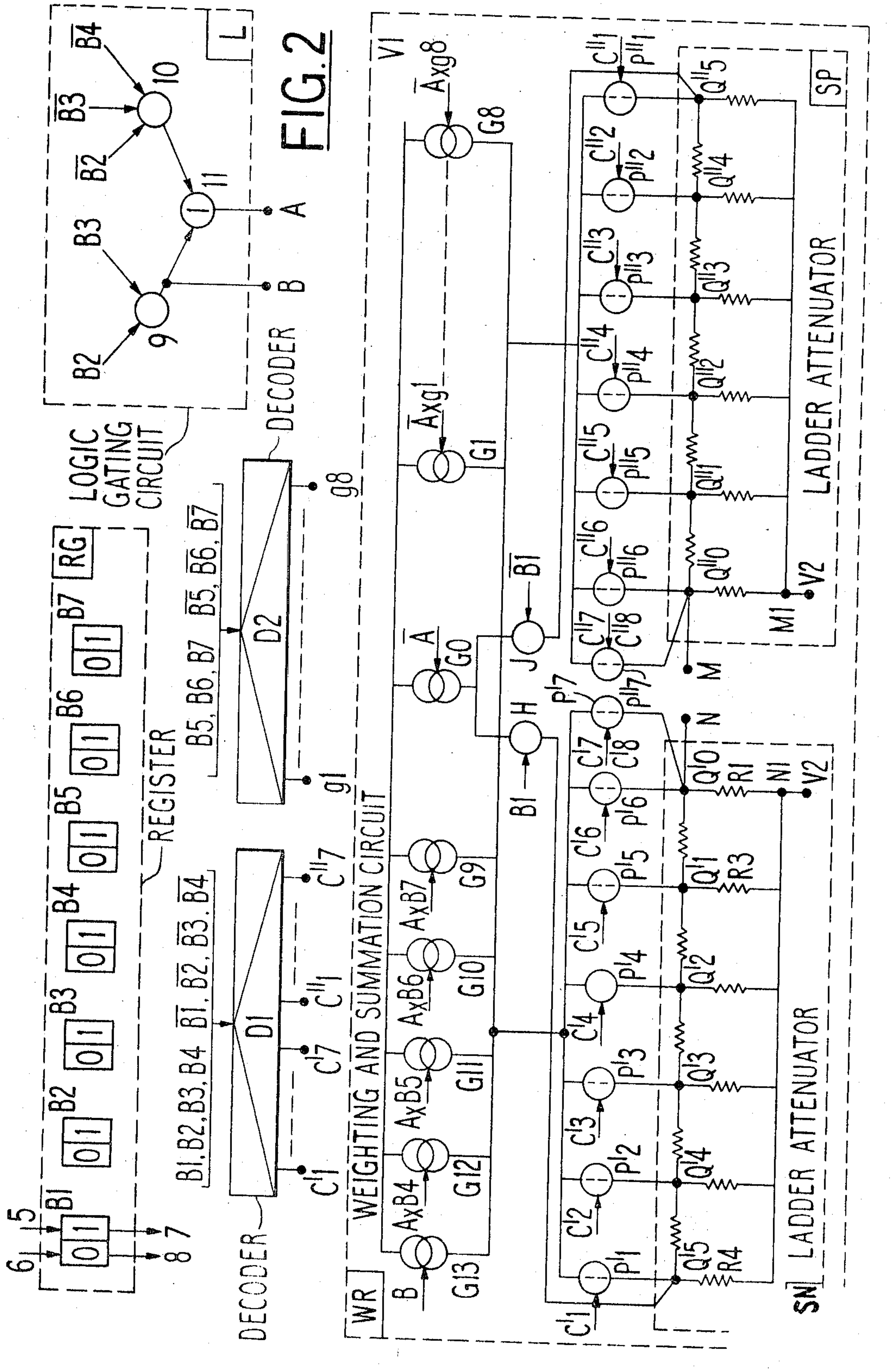
FIG. 2 illustrates a preferred embodiment of a decoder presenting features of the present invention.

In FIG. 2 it has been represented a particular achievement of a decoder, the characteristic curve of which is the one of FIG. 1. In this FIG. 2, the symbol bearing the reference 9 represents a coincidence electronic gate called AND circuit, which supplies a positive signal on its output when its inputs, represented by arrows touching the circle receive simultaneously a positive signal. If we call B2 and B3 the signals which are present on each one of the two inputs, this circuit achieves the logical condition noted $B2 \times B3$.

A symbol such that the one bearing the reference 11 comprising a 1 digit surrounded by a circle designates a mixing electronic gate, called OR circuit, which supplies a positive signal on its output when a positive signal is applied at least on one of its inputs represented by arrows touching the circle. If C and D designate the signals which are present on each one of the two inputs, this circuit achieves the logical condition noted $C + D$.

A symbol such that the one referenced B1 designates a bistable circuit or flip-flop to which a control signal is applied on one of its inputs 5 or 6 in order to set it respectively to the 1 state or to the 0 state. A voltage of same polarity as the controlled signal is present, either on the output 7, when the flip-flop is in the 1 state, or on the output 8, when it is in the 0 state. The logical condition characterizing the fact that the flip-flop is in the 1 state will be written B1, the one characterizing the fact that it is in the 0 state will be written B1.

The symbol referenced RG designates a register comprising seven flip-flops defined previously and referenced B1 to B7; these flip-flops are assigned to different digits of the code, the most significant digit being that displayed by the flip-flop B1. In the continuation of the description, we shall call $b1$, $b2$, $b3$, $b4$, $b5$, $b6$ and $b7$ the different digits of the code displayed respectively by the flip-flops B1, B2, B3, B4, B5, B6 and B7.

A symbol such that the one referenced D2 represents a decoder circuit which, in the case of the example, transforms a 3-digit binary code applied by the group of six output conductors of the flip-flops B5, B6 and B7 of the register RG into a code of the type "one among eight," i.e., that a positive signal appears only on one among the eight output conductors $g1$, to $g8$ for each one of the codes displayed by the flip-flops B5, B6 and B7 of the register RG.

A symbol such that the one referenced G1 represents a current generator which delivers a constant current of amplitude for the 1 in an impedance, the value of which is very low with respect to the internal impedance of the said generator. This generator is started by the application of a control signal $\bar{A} \times g1$. RG.

In FIG. 2, the decoder according to the invention comprises the register RG comprising the flip-flops B1 to B7 for the writing of the codes comprising $n = 7$ digits, the decoders D1 and D2, a logical circuit L and the weighting and summation circuit WR which supplies between the terminals M and N, a voltage characterizing the value of the code displayed in the register RG.

The weighting and summation circuit WR comprises two ladder attenuators SN and SP connected to the current generators G0 to G13 through electronic gates P'1 to P'7 in what concerns the ladder attenuator SN and through electronic gates P''1 to P''7 in what concerns the ladder attenuator SP.

As it has been seen in relation with FIG. 1, each half-characteristic comprises a logarithmic central part and two lateral linear parts. We shall describe first how the logarithmic part PG is obtained, than the way by which the linear parts, the representative straight lines of which are tangent to the logarithmic curve at the point P and Q will be described afterwards.

The elements which enable to obtain the logarithmic part comprise mainly a group of nine generators G0 to G8 supplying the ladder attenuators SN and SP through the electronic gates. This circuit is analog to the one described in the copending application, now U.S. Pat. No. 3,562,743 issued Feb. 9, 1971 to C.P.H. Lerouge-D.C. Strube 8-3 which described a decoder with logarithmic characteristic; however, it differs therefrom by the fact that, in the decoder object of the present invention, the logarithmic curve is limited; besides, since the equation of the curve is different, the values of the attenuation introduced by each cell of the ladder attenuator and the relative values of the currents supplied by the current generators G0 to G8 are different. Thus, the values of the currents $I_1$ to $I_8$ supplied respectively by the current generators G1 to G8, are in geometrical progression of ratio $10^{1/24}$. On the other hand, the attenuation ratio of each cell of the two ladder attenuators is $10^{1/3}$.

These two coefficients are determined from the formula (2). In effect, if we take into account only the digits *b*2, *b*3, *b*4, *b*5, *b*6 and *b*7 which determines the amplitude of the voltage, the variable *y* of the equations (1), (2) and (3) may be written under the form: $y = b2/2+b3/4+b4/8+b5/16+b6/32+b7/64$, the digits *b*2 to *b*7 taking the decimal value 0 or 1. The equation (2) may then be written:

$$253x = 10^{1/3 \cdot 1/8(4b2+2b3+b4)} \cdot 10^{1/24 \cdot 1/8(4b5+2b6+b7)} - 0.5 \quad (4)$$

or also $253x = K \cdot -0.5$ (5)

On FIG. 2, the coefficient *T* is obtained by eight current generators G1 to G8 which supply currents $I_1$ to $I_8$ varying in geometrical progression of ratio $10^{1/24}$. Thus, if $I_1$ designates the current supplied by the generator G1, the current $I_8$ supplied by the generator G8 will be $10^{7/24}$, vizus 1,96 $I_1$. The choice of either one or the other of these eight generators is obtained by the decoding of the digits *b*5 to *b*7 of the code, the decoding being carried out according to a normal binary scale, i.e., that to the code 000 corresponds the output *g*1, to the code 001 corresponds the output *g*2, and so on up the code 111 to which corresponds the output *g*8.

The coefficient *K* is obtained by one of the ladder attenuators SN or SP each cell of which introduces an attenuation of $10^{1/3}$. With such a coefficient, it results that if we inject a current I at the point Q'0 of the ladder network SN a voltage V appears between the point N and the point N1, and if we shift the injection point towards the left hand side of the figure, the voltage V decreases each time by a ratio $10^{1/3}$. It is thus seen that the attenuation ratio is a negative 1/3 of $10^{1.3}$ the exponent of which is given by the digit of the reference at the point of injection. Thus, a current injected at the point Q'2 produces a voltage attenuated by a ratio of $10^{-2/3}$ with respect to the same current injected at the point of Q'0.

In FIG. 2, owing to the direction of the currents supplied by the current generators, the said current generators are connected to the supply voltage V1 whereas the points M1 and N1 of the ladder attenuators are connected to a voltage V2, such that $V2 < V1$.

The product *K·T* is obtained by injecting the current supplied by one of the generators G1 to G8 in a point of one of the ladder attenuators, the choice of the point of injection being carried out by the electronic gates P'2 to P'6 and P''2 to P''6 controlled respectively by the signals C'2 to C'6 and C''2 to C''6 resulting from the decoding of the four most significant digits *b*1, *b*2, *b*3 and *b*4; in this decoding, the most significant digit *b*1 determines the ladder attenuator in which the current is injected.

Since the part PQ of the characteristic curve of FIG. 1 corresponds to a section of logarithmic curve comprised between the ordinates 1/8 (codes C'2 to C 2) and 3/4 (codes C'7 and C''7), it is understood that the number of cells of the ladder attenuator has been limited to four. We understand also that if the logarithmic curve had been described entirely between the points of ordinates 0 and 1, the number of cells would have been of seven, the three additional cells being arranged, in which concerns the attenuator SN, the one on the left hand side of the point Q'4 and the two others on the right hand side of Q'0.

The term −0.5 is obtained by a current generator G0 supplying a current $I_0$ which is switched to the point Q''5 or the point Q'5 through the electronic gates J and H controlled respectively by the signals of the state $\overline{B1}$ and B1 of the flip-flop B1. The value of this current $I_0$ will be determined by observing that if the section PQ (FIG. 1) was extended up to the point of abscissa $y = 0$ which corresponds to the code 0 0 0 0 0 0 0 or to the code 1 0 0 0 0 0 0, the equation (2) shows that we should have $253x = 1 - 0.5 = 0.5$. But, for these codes, the current generator G1 would be opened and would supply the ladder attenuator either at the point Q'5 for the code 0 0 0 0 0 0 0, or at the point Q''5 for the code 1 0 0 0 0 0 0, it is this which corresponds to the 1 digit of the preceding equation. The term 0.5 is thus obtained by means of a current generator G0 which supplies, for instance, a current $I_0 = I_1/2$ and the sign − is obtained for instance by injecting this current $I_0$ at the point Q''5 when the code is 0 0 0 0 0 0 0 or at the point Q'5 when the code is 1 0 0 0 0 0 0. To sum up, this additional current $I_0$ is injected into the ladder attenuator which does not receive current from one of the generators G1 to G8.

It will be observed that other solutions exist consisting, for instance, in using a current generator G'0 supplying a current $I'_0$ smaller than $I_1/2$ but which will be injected in another point of the ladder attenuator. We may also use a current generator G0 supplying a current $I_0$ of direction opposite to the currents supplied by the current generators G1 to G8 and inject the said current $I_0$ in the ladder attenuator which receives the current supplied by one of the generators G1 to G8.

The values of the resistors R2 and R3 of each cell of the identical ladder attenuators SN and SP are determined according to the value R of the resistor R1 and to the attenuation coefficient $a = 10^{1/3}$ which has to be obtained for each cell. It is then demonstrated that: $R2 = (a - 1)R$ and $R3 = a\ R/a - 1$; besides, the resistor in parallel R4 has the value *R*.

The linear part QR of equation $253x = 614y - 361$ is obtained by elaborating a pedestal voltage corresponding to the point Q to which a voltage varying linearly with the codes is added. This pedestal voltage is obtained by means of a current generator G13 which supplies a current $I_{13}$ which is injected, for instance, at the point Q''0 in the case of a code corresponding to a positive signal. The value of this current $I_{13}$ must be such that the voltage $V_M - V_N$ is equal to that which would be obtained with the logarithmic section for the code 1 1 1 0 0 0 0 corresponding to the point Q. For this code, the generator G1 would be open and its current $I_1$ would be injected in the ladder attenuator SP, assumed to be complete with seven cells, at the point immediately on the left hand side of Q''0. It is thus understood that the current $I_{13}$ should be equal to $I_1$ and injected in this point immediately on the left hand side of Q''0 and thus it should be necessary to add a cell on the left hand side of the attenuator SP. In order to avoid the addition of an additional cell, it is possible to make provision for a generator G13 which supplies a current $I_{13}$ a times higher that the current $I_1$, the said current being injected at the point Q''0; we have thus $I_{13} = 10^{1/3} I_1$.

The linear variation of the voltage for the part QR is obtained through current generators G9 to G12 controlled respectively by the digits *b*7, *b*6, *b*5 and *b*4 of the code; if I designates the current supplied by the current generator G9, the current generators G10, G11 and G12 supply respectively the currents 2I, 4I and 8I. The sum of the currents supplied by the generator G13 and by the current generators opened by the state signals of the flip-flops B4 to B7 is injected at the point Q''0 through the electronic gate P''7 which is opened by the signal C''7 or the signal C''8. The value of the elementary current $I = I_9$ supplied by the generator G9 will be determined further on.

The generator G13 is opened only for the linear part QR since the signal B appears only for the codes C''7 and C''8, i.e., for the condition $B2 \times B3$ achieved by the AND-circuit 9 of the circuit L. The generators G9 to G12 can be opened only in presence of the signal A which results from the condition $B2 \times B3 + \overline{B2} \times \overline{B3} \times \overline{B4}$ achieved by the AND-circuits 9 and 10 and the OR circuit 11 of the circuit L. This condition appears only for the two linear parts MP (code C''1) and QR (codes C''7 and C''8).

The linear part MP is obtained by means of these same current generators G9 to G11, but the sum of the currents has to be attenuated by a ratio corresponding to a ratio of the slopes of the two line segments QR and MP. The equations (1) and (3) show that this ratio if equal to $46.4 = 10^{5/3}$, i.e., that this attenuation corresponds to that one of five cells of the attenuator SP. Therefore, for the linear part MP, the sum of the currents is injected at the point Q''5 through an electronic gate P''1 controlled by the signal C''1.

It will be observed that this ratio of the slopes of the line segments QR and MP equal to an integer multiple of the attenuation of one cell of the attenuator is due to the fact that these line segments are tangential lines to the logarithmic curve PQ at the points P and Q.

This method for obtaining line segments, the slopes of which are in given ratios has already been described in the copending application Ser. No. 686,072 filed Nov. 28, 1967, now allowed, for A.Y. Le Maout-C.P.H. Lerouge 3–6, in which the characteristic was a multilinear curve.

The values of the currents supplied by the current generators G9 to G12 will be now determined by observing that the point P is at the same time on the line segment MP and on the logarithmic curve PQ. If the point P, corresponding to the code 1 0 0 1 0 0 0, was obtained by utilizing the linear characteristics, the generator G12 only would be opened and would supply a current $I_{12} = 8I$ which would be injected at the point Q''5. The point P is obtained in fact by using the logarithmic characteristic, i.e., by injecting on the one hand the current $I_0 = I_1/2$ supplied by the current generator G0 at the point Q''5 and on the other hand the current $I_1$ supplied by the current generator G1 at the point Q''4. This same point P could have been obtained by injecting a current $I''_0 = -I_1/2$ and a current $I'_1 = 2.15\ I_1$ at the point Q''5 of the ladder attenuator; therefore, we have to have the equality:

$$I_{12} = 8I = I'_0 = 2.15\ I_1 - I_1/2 = 1.65\ I_1.$$

The operation of the decoder of FIG. 2 will be described by assuming that the binary number to be decoded is 1 1 0 1 1 1 1. The electronic gate H is opened and a current $I_0 = I_1/2$ is injected at the point Q'5 of the ladder attenuator SN. Owing to the absence of the signal A (signal $\overline{A}$) and to the decoding, by the decoder D2, of the three least significant digits, i.e., the code 1 1 1, the current generator $I_8$ is opened and supplies a current $I_8 = I_1\ 10^{7/24} = 1.96\ I_1$. This current $I_8$ is injected at the point Q''0 of the ladder attenuator since the electronic gate P''6 is opened by the signal C''6 resulting from the decoding, by the decoder D1, of the four most significant digits, i.e. the code 1 1 0 1. The voltage decoded is the voltage $V_M - V_N$ appearing between the the output terminals M and N of the two ladder attenuators SN and SP.

As it has been noticed previously, the decoder described in relation with the FIG. 2 may be used on the one hand as an expansion-decoder device, and on the other hand, as a decoder associated to a compression-decoder device, the encoding being carried out by feedback comparison. However, when the decoder is used as an expansion-decoder device, it is desirable, but not necessary, to modify the circuit of FIG. 2. In effect, when the codes displayed in the register are 1 0 0 0 0 0 0 and 0 0 0 0 0 0 0, the decoder of FIG. 2 gives a voltage $V_M - V_N$ which is nil. But these two codes correspond in fact one to a positive voltage and the other one to a negative voltage, these two voltages being lower than the first quantisation step; besides, the decoding error in the whole range is of one quantisation step. In order to obtain a positive decoded voltage when the code is 1 0 0 0 0 0 0 and a negative decoded voltage when the code is 0 0 0 0 0 0 0, the solution consists in making provision for an additional current generator GS supplying a current $I_S$ corresponding to a half-quantisation step in the zone MP, vizus a current $I_S = I/2$. This current generator GS is opened by the signal A supplied by the logical circuit L and is activated thus for the two linear parts, but with different weights since the injection point in the ladder network is different. By this current $I_S$, one is placed in the middle of the segment joining the representative points of the two successive codes so that the decoding error is reduced to a half-quantisation step.

This solution is not obviously valid for the logarithmic part; in this case, the solution consists in modifying the values of the currents supplied by the current generators G1 to G8 in such a way that the voltage decoded corresponds to a voltage halfway between the extreme limits of the zone assigned to a determined code. In order to obtain this result, it is sufficient to multiply each one of the currents $I_1$ to $I_8$ by the coefficient $10^{1/48}$ which corresponds to the square root of the geometrical progression linking the currents $I_1$ to $I_8$.

The invention has been described in the case of a compression curve MPQR comprising three parts defined by the equations (1), (2) and (3); however, the invention may be applied also for obtaining any compression curve comprising a logarithmic part of equation $a{\cdot}x = k^y +$ a constant extended by straight line segments tangent to the logarithmic curve at the end points of the logarithmic part. More generally, the invention may be applied also for obtaining any compression curve comprising a succession of linear parts and of logarithmic parts corresponding to one same curve, the linear parts being constituted by two straight lines segments tangent to the logarithmic curve. It will be observed that these logarithmic parts may also correspond to different logarithmic curves.

In the particular example described, the codes had seven digits, however, the invention is applied also to codes having a different number of digits.

While the principles of the above invention have been described in connection with specific embodiments and particular modifications thereof it is to be clearly understood that this description is made by way of example and not as a limitation of the scope of the invention.

What we claim is:

1. A digital-to-analog decoder for a multi-digit number adapted to produce an analog output with a voltage amplitude characteristic which is symmetric with respect to a zero abscissa, the positive and negative half-characteristics comprising three parts: a first linear part near the origin, a logarithmic part, a second linear part, said both linear parts being tangential extensions of the ends of said logarithmic part; said decoder comprising a digit register and two ladder attenuators, first decoding means for decoding the most significant digits of said number, second decoding means for decoding the least significant digits, a first group of current generator means controlled by the signals corresponding to the lest significant digits, a second group of current generator means controlled by the output signals of said second decoding means, electronic gate means controlled responsive to the output signals of said first decoding means operatively connected between the current generators and the two ladder attenuators such that the generated current is selectively gated to said ladder attenuators and means for taking said analog voltage from between output terminals on the two ladder attenuators to form the voltage amplitude characteristic representative of said number.

2. The decoder of claim 1 wherein said first and second ladder attenuators are identical.

3. The decoder of claim 1 wherein said register comprises a seven digit register, four of said digits are said most significant digits, and the remaining three of said digits are said least significant digits.

4. The decoder of claim 1 and means responsive to the value of the most significant digits for selecting the polarity of said signal.

5. A decoder of binary numbers comprising seven digits comprising, means responsive to the most significant digits of a a number of selecting the polarity of an output analog voltage, means responsive to the other digits of said number for providing the amplitude of the output analog voltage measured on both sides of the level of the nil voltage to produce a characteristic symmetrical with respect to the zero abscissa point, the characteristic comprising a logarithmic part and linear parts at both extensions of said logarithmic part, register means for being the binary numbers to be decoded, first decoder means for decoding the four most significant digits of the said binary number, second decoder means for decoding the other digits of the same binary number, two identical ladder attenuator means, each attenuator means comprising five identical cells, a first multiplicity of current generator means controlled by the output signals of the second decoder means when the binary number corresponds to the logarithmic part, and a second multiplicity of current means controlled by the four least significant digits of the binary number when the binary number corresponds to a linear part, and a plurality of electronic gate means arranged between the current generators and the two attenuators and controlled by the output signals of the first decoder means, a first additional generator means associated with the first multiplicity of current generator means, means for injecting the current of said first multiplicity of current generator means into the other ladder attenuator through two of said electronic gate means controlled by the signal corresponding to the most significant digit of the binary number, a second additional current generator means associated with the second multiplicity of current generator means which supplies a current only for the binary numbers corresponding to the one linear part, and means for taking the decoded voltage from between the output terminals of the two ladder attenuator means.

6. A digital-to-analog decoder of seven-digit binary numbers the most significant of which characterizes the polarity of the analog voltage output, the other digits characterizing the amplitude of the voltage with respect to the zero voltage, said decoder forming a characteristic curve which is symmetric with respect to zero abscissa, each half-characteristic comprising three parts: a first linear part near the origin, a logarithmic part, a second linear part, said both linear parts being tangential to ends of said logarithmic part; the invention comprising a seven-digit register, two identical ladder attenuators, one for developing each half-characteristic, first decoding means for decoding the four most significant digits and producing output signals, second decoding means for decoding the three other digits and producing output signals, a first group of current generators controlled by the signals corresponding to the four least significant digits of the codes, a second group of current generators controlled by the output signals of second decoding means, a multiplicity of electronic gates controlled by the output signals of said first decoding means and operatively connected between the current generators and the two ladder attenuators such that the generated current is selectively gated to said ladder attenuators; whereby the decoded analog voltage following said characteristic is taken between terminals of the two ladder attenuators.

* * * * *